United States Patent [19]
Jiang et al.

[11] Patent Number: 5,719,892
[45] Date of Patent: Feb. 17, 1998

[54] HYBRID MIRROR STRUCTURE FOR A VISIBLE EMITTING VCSEL

[75] Inventors: Wenbin Jiang, Phoenix; Philip Kiely, Gilbert; Michael S. Lebby, Apache Junction, all of Ariz.

[73] Assignee: Motorola, Inc., Schaumburg, Ill.

[21] Appl. No.: 636,488

[22] Filed: Apr. 23, 1996

[51] Int. Cl.⁶ .............. H01S 3/19; H01S 3/08; H01L 21/20
[52] U.S. Cl. .............. 372/45; 372/96; 438/22
[58] Field of Search .............. 372/99, 96, 92, 372/46, 45, 22; 438/22

[56] References Cited

U.S. PATENT DOCUMENTS

| | | | |
|---|---|---|---|
| 5,256,596 | 10/1993 | Ackley et al. | 372/45 |
| 5,343,487 | 8/1994 | Scott et al. | 372/45 |
| 5,359,618 | 10/1994 | Lebby et al. | 372/96 |
| 5,428,634 | 6/1995 | Bryan et al. | 372/45 |
| 5,495,577 | 2/1996 | Choquette et al. | 372/96 |
| 5,557,626 | 9/1996 | Grodzinski et al. | 372/45 |
| 5,588,016 | 12/1996 | Otoma et al. | 372/46 |

*Primary Examiner*—Rodney B. Bovernick
*Assistant Examiner*—Luong-Quyen T. Phan
*Attorney, Agent, or Firm*—Eugene A. Parsons

[57] ABSTRACT

A hybrid mirror structure for a visible emitting VCSEL including a first distributed Bragg reflector disposed on a substrate and including first pairs of alternating layers including an oxidized aluminum material and second pairs of alternating layers. A first cladding region disposed on the first distributed Bragg reflector, an active region disposed on the first cladding region, and a second cladding region disposed on the active region, and a second distributed Bragg reflector disposed on the second cladding region. In the first distributed Bragg reflector, each pair of alternating layers includes a layer containing oxidized aluminum. Alternate layers contain AlAs which is oxidized to decrease the index of refraction to a range of approximately 1.3 to 1.7.

24 Claims, 2 Drawing Sheets

HYBRID MIRROR STRUCTURE FOR A VISIBLE EMITTING VCSEL

FIELD OF THE INVENTION

This invention relates, in general, to layered optical devices and, more particularly, to semiconductor lasers.

BACKGROUND OF THE INVENTION

At present, conventional edge emitting semiconductor lasers play a significant role in optical communication due to their high operating efficiency and modulation capabilities; however, the edge emitting semiconductor lasers have several short comings or problems, thus making the edge emitting laser device difficult to use in several applications.

Recently, however, there has been an increased interest in vertical cavity surface emitting lasers (VCSEL)s. The conventional VCSEL has several advantages, such as emitting light perpendicular to the surface of the die, and the possibility of fabrication of two dimensional arrays. However, while conventional VCSELs have several advantages, conventional VCSELs have several disadvantages with regard to emission in the visible spectrum primarily due to the poor reflectivity of the distributed Bragg reflectors. Because of this, manufacturability of VCSELs for the visible spectrum is severely limited.

Conventionally, reflectivity problems are solved by increasing the number of reflective elements or alternating layers that comprise the conventional distributed Bragg reflectors. However, in this case, this approach may not solve the reflectivity problems (due to increased reflector losses and narrowing of the bandwidth of the reflector), but exacerbates several other problems, such as manufacturability, defect density, higher resistance and the like, thus making the conventional approach not a viable solution to the problem.

For example, in an attempt to increase reflectivity of Bragg reflectors in the VCSEL, many additional alternating layers (e.g., as many as 50 to 200 additional alternating layers) are deposited. However, increasing the number of alternating layers increases the cost and complexity of manufacturing. More particularly, with the increased number of alternating layers, an increase in defect density of the alternating layers may be produced, as well as an increase in the amount of time required to manufacture the layers. Also, the series resistance increases with increased alternating layers, potentially impacting the temperature performance of the device. Thus, adding additional layers to a conventional VCSEL results in a substantial increase in the cost of manufacturing conventional VCSELs as well as a decrease in the quality of the VCSELs manufactured, As a result, conventional VCSELs fabricated in this fashion are generally not suitable for high volume manufacturing for this purpose.

It can readily be seen that conventional edge emitting semiconductor lasers and conventional approaches to vertical cavity surface emitting lasers have several disadvantages and problems, thus not enabling their use in high volume manufacturing applications. Therefore, a VCSEL and method for making that simplifies the fabrication process, reduces cost, with an improved reliability of the VCSEL would be highly desirable.

BRIEF SUMMARY OF THE INVENTION

The above problems and others are at least partially solved and the objects of this invention are realized in a hybrid mirror structure for a visible emitting vertical cavity surface emitting laser including a first distributed Bragg reflector disposed on the surface of a supporting substrate and including first pairs of alternating layers formed of an oxidized aluminum material and second pairs of alternating layers, with the first pairs of alternating layers being positioned adjacent the supporting substrate and the second pairs of alternating layers being positioned on the first pairs of alternating layers. A first cladding region is disposed on the first distributed Bragg reflector, an active region disposed on the first cladding region, and a second cladding region disposed on the active region. A second distributed Bragg reflector is disposed on the second cladding region.

DETAILED DESCRIPTION OF THE DRAWINGS

Figure 1:
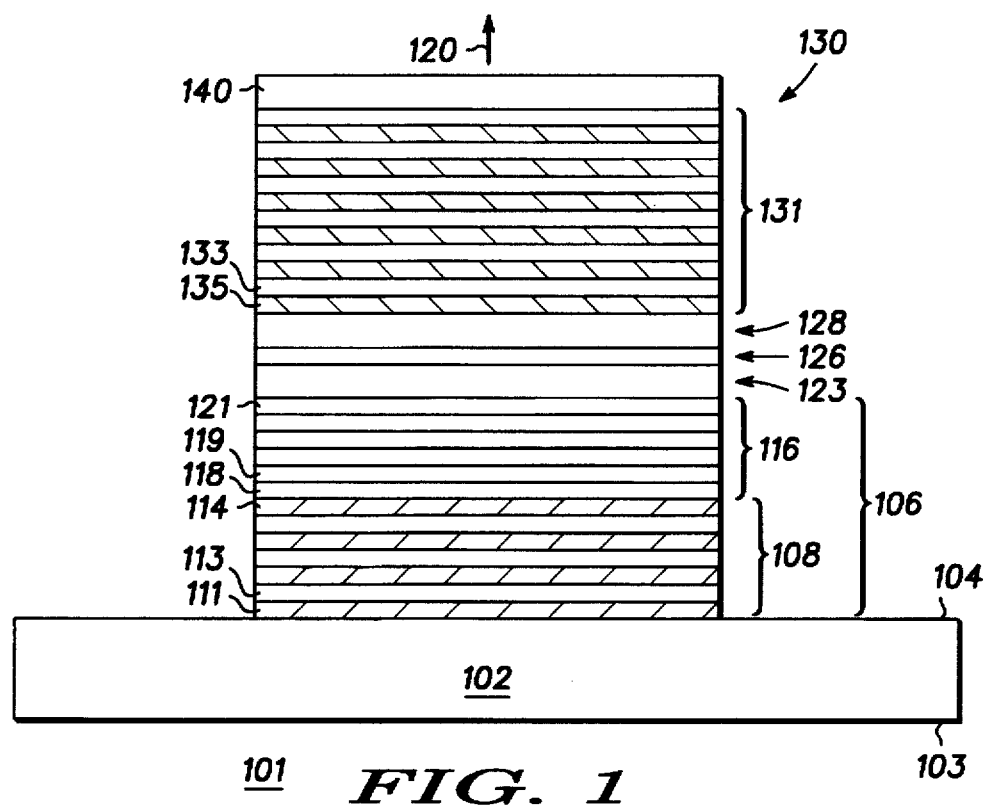
FIG. 1 is an enlarged simplified cross-sectional view of a VCSEL device prepared on a substrate in accordance with the present invention.

FIG. 1 illustrates a simplified enlarged vertical cavity surface emitting laser (VCSEL) 101 formed on a substrate 102 having surfaces 103 and 104 with light 120 being emitted from VCSEL 101. It should be understood that while FIG. 1 only illustrates a single VCSEL 101, VCSEL 101 may represent many VCSELs that are located on substrate 102 to form arrays. Generally, VCSEL 101 is made of several defined areas or regions, such as a distributed Bragg reflector 106 having a plurality of alternating layers 108 illustrated by layers 111 and 113 and a plurality of alternating layers 116 illustrated by layers 118 and 119, a cladding region 123, an active region 126, a cladding region 128, a distributed Bragg reflector 130 having a plurality of alternating layers 131 illustrated by layers 133 and 135, and a contact region 140.

Substrate 102, in this example, is made of any suitable material, such as gallium arsenide, silicon, or the like. Typically, substrate 102 is made of gallium arsenide so as to facilitate epitaxial growth of subsequent multiple layers that comprise VCSEL 101.

Typically, any suitable epitaxial deposition method, such as molecular beam epitaxy (MBE), metal organic chemical vapor deposition (MOCVD), or the like is used to deposit the required multiple layered structures, such as distributed Bragg reflector 106, having the plurality of alternating layers 108 and the plurality of alternating layers 116, cladding region 123, active region 126, cladding region 128, distributed Bragg reflector 130, and a contact region 140 for VCSEL 101. Also, it should be understood that many of these layers are made of compound semiconductor materials, such as indium aluminum gallium phosphide, aluminum arsenide, gallium arsenide, aluminum gallium arsenide, aluminum gallium phosphide, indium aluminum phosphide, and the like. It should be understood that epitaxial deposition is used extensively to produce the multitude of layers that comprise the VCSEL 101.

Generally, thicknesses of the plurality of alternating layers 106, the plurality of alternating layers 130, cladding region 123, cladding region 128, active region 126, and contact region 140 are set out as portions of a wavelength of light 120 being emitted by VCSEL 101. For example, with VCSEL 101 being designed to emit light 120 at 670 nanometers, optical thickness of each alternating layer 133, and 135 is set at 167.5 nanometers, thereby making the thickness of each alternating layer 133, and 135 one quarter of the wavelength of light 120 being emitted from VCSEL 101. The plurality of alternating layers 116 form a standard section of the lower Bragg reflector. The plurality of alternating layers 108 form an additional section of the lower Bragg reflector. One layer in each segment (pair) of alternating layers 108 is selectively oxidized (to be explained). The thickness of the oxidized layers is chosen such that it is one quarter wavelength after oxidation. Additionally, it should be understood that other thicknesses or portions of the wavelength can be used such as, one half, three quarter, or any multiple thereof.

Doping of VCSEL 101 is achieved by the addition of dopant materials, e.g., n-type dopants and p-type dopants to epitaxial materials used for epitaxial deposition, thereby doping the epitaxially deposited material. While many different dopant concentrations, specific dopant materials, and placement of dopant materials can be used, generally, alternating layers 116 of distributed Bragg reflector 106 are n-type doped with selenium, silicon, or the like to a concentration ranging from 1E15 to 1E20 $cm^{-3}$, with a preferred range from 1E17 to 1E19 $cm^{-3}$, with a nominal range from 5E17 to 1E18 $cm^{-3}$, whereas distributed Bragg reflector 130 is p-type doped with carbon, zinc, or the like to a concentration ranging from 1E15 to 1E20 $cm^{-3}$, with a preferred range from 1E17 to 1E19 $cm^{-3}$, and a nominal range from 1E18 to 5E18 $cm^{-3}$.

Distributed Bragg reflector 106 is made of the plurality of alternating layers 108 and the plurality of alternating layers 116. As stated earlier, the plurality of alternating layers 108 will be oxidized during processing to form a highly reflective partial mirror. The plurality of alternating layers 108 further include one or more layers of aluminum arsenide, illustrated by a layer 111, and one or more layers of aluminum gallium arsenide, illustrated by a layer 113. By way of example, with substrate 102 being gallium arsenide, layer 111 of aluminum arsenide (e.g., AlAs) is epitaxially deposited on surface 104 of substrate 102, with layer 113 of aluminum gallium arsenide (e.g., $Al_{0.5}Ga_{0.5}As$) being subsequently epitaxially deposited on layer 111, thereby making a mirror pair or a pair of reflectors (e.g., AlAs/$Al_{0.5}Ga_{0.5}As$). If additional mirror pairs are required, several more layers, i.e., additional mirror pairs, are deposited on the existing layers 111 and 113.

Generally, alternating layers 108 can have from one pair to twenty pair of mirrors, with a preferred number of pairs ranging from three to ten pairs, and with a nominal number of pairs being four to six pairs. Additionally, applicant believes that five mirrored pairs of aluminum arsenide and aluminum gallium arsenide give an appropriate reflectivity performance for VCSEL 101 operating in the visible spectrum once oxidation has taken place in the fabrication sequence. However, it should be understood that the number of alternating layers 111 and 113 can be adjusted for specific applications. Also, it should be noted that layer 114 is made of aluminum arsenide and forms a top layer for alternating layers 108. It should be further understood that in the examples where a percent composition of a particular element is given it should be considered only as an example and that these variations from these examples can be large and are also part of the present invention.

For example, by selecting aluminum arsenide and aluminum gallium arsenide (AlAs/$Al_{0.5}Ga_{0.5}As$) as a material structure for distributed Bragg reflector 106, the aluminum and the gallium of the aluminum gallium arsenide can be varied. Generally, the aluminum of the aluminum gallium arsenide can range from 0 percent to 100 percent, with a preferred range from 46 percent to 54 percent in $Al_{0.5}Ga_{0.5}As$ Once the plurality of alternating layers 108 have been deposited on substrate 102, the plurality of alternating layers 116 are epitaxially deposited on the plurality of alternating layers 108. Generally, the plurality of alternating layers 116 further include one or more layers of indium aluminum gallium phosphide, illustrated as a layer 118, and one or more layers of indium aluminum phosphide, illustrated by a layer 119. By way of example, with substrate 102 being gallium arsenide, with the plurality of alternating layers 106 being aluminum arsenide and aluminum gallium arsenide (e.g., AlAs/$Al_{0.5}Ga_{0.5}As$), respectively, layer 118 of indium aluminum gallium phosphide (e.g., $In_{0.49}Al_{0.1}Ga_{0.41}P$) is deposed on layer 114 with a subsequent layer 119 of indium aluminum phosphide (e.g., $In_{0.49}Al_{0.51}P$) being deposited on the indium aluminum gallium phosphide layer 118, thereby making another mirror pair. Generally, the plurality of alternating layers 116 can range from one pair to twenty pair of mirror pairs, with a preferred number of pairs being from three to ten, and with a nominal number of pairs being four to six. It is believed that five mirrored pairs of indium aluminum gallium arsenide and indium aluminum phosphide, in conjunction with the plurality of alternating layers 108, give appropriate reflectivity performance for VCSEL 101 operating in the visible spectrum. In addition to increasing the reflectivity of distributed Bragg reflector 106, alternating layers 116 provide an N-metal contact for VCSEL 101 and inhance the reliability of VCSEL 101 by including indium, which aids in preventing the migration of dislocations and the like to active region 126. However, it should be understood that the number of alternating layers 118 and 119 can be adjusted for specific applications.

It should be further understood that in the examples where a percent composition of a particular element is given it should be consider only as an example. It should be further understood that variation from these examples can be large and are also part of the present invention.

For example, reflectivity from the indium aluminum gallium phosphide can be achieved by having a percent composition of indium ranging from 46 percent to 54 percent. By varying the percent composition of indium, a corresponding variation in a percent composition of gallium occurs. Additionally, aluminum percent concentration can range from 1 percent to 20 percent with a nominal range from 7 percent to 13 percent. It should be pointed out that the percent composition of the aluminum reduces the percent concentration of gallium, thereby producing a balanced composition.

For the sake of simplicity and to prevent overcrowding of the figure, cladding regions 123 and 128 are each shown as a single layer; however, it should be understood that each cladding region 123 and 128 can be made of more than one layer epitaxially disposed or deposited on a previous layer (e.g. Bragg reflector 106 and active region 126), with cladding layers 123 and 128 being made of any suitable doped or undoped material such as undoped indium aluminum gallium phosphide epitaxially deposited. Also, active region 126 is represented by a single layer which is epitaxially deposited or disposed on cladding region 123; however, it should be understood that active region 126 can include one or more quantum wells, etc.

Distributed Bragg reflector 130 is made of the plurality of alternating layers 131. The plurality of alternating layers 130 further include one or more layers of aluminum arsenide, illustrated by a layer 133, and one or more layers of aluminum gallium arsenide, illustrated by a layer 135. By way of example, a layer of aluminum arsenide (e.g., AlAs) is epitaxially deposited on cladding region 128, with a layer of aluminum gallium arsenide (e.g., $Al_{0.5}Ga_{0.5}As$) being subsequently epitaxially deposited on the layer of aluminum arsenide, thereby making another mirror pair or another pair of reflectors (e.g., $AlAs/Al_{0.5}Ga_{0.5}As$). If additional mirror pairs are required, several more layers, i.e., additionally mirror pairs are deposited on the existing layers of aluminum arsenide and aluminum gallium arsenide.

Generally, the plurality of alternating layers 130 are from one pair to fifty mirror pairs, with a preferred number of mirror pairs ranging from ten to forty pairs, and with a nominal number of mirror pairs ranging from twenty to thirty mirrored pairs, and an optimum number of twenty eight mirror pairs. However, it should be understood that the number of mirror pairs can be adjusted for specific applications.

A heavily doped contact layer 140 is formed on the upper surface of distributed Bragg reflector 130 and an electrical contact (not shown) is formed on layer 140 by disposing any suitable conductive material on layer 140, such as indium tin oxide, gold, platinum, or the like. It should be understood that depending upon which material selection is made the specific method of disposing and patterning of that specific material will change to form contact layer 140 and the electrical contact.

Figure 2:
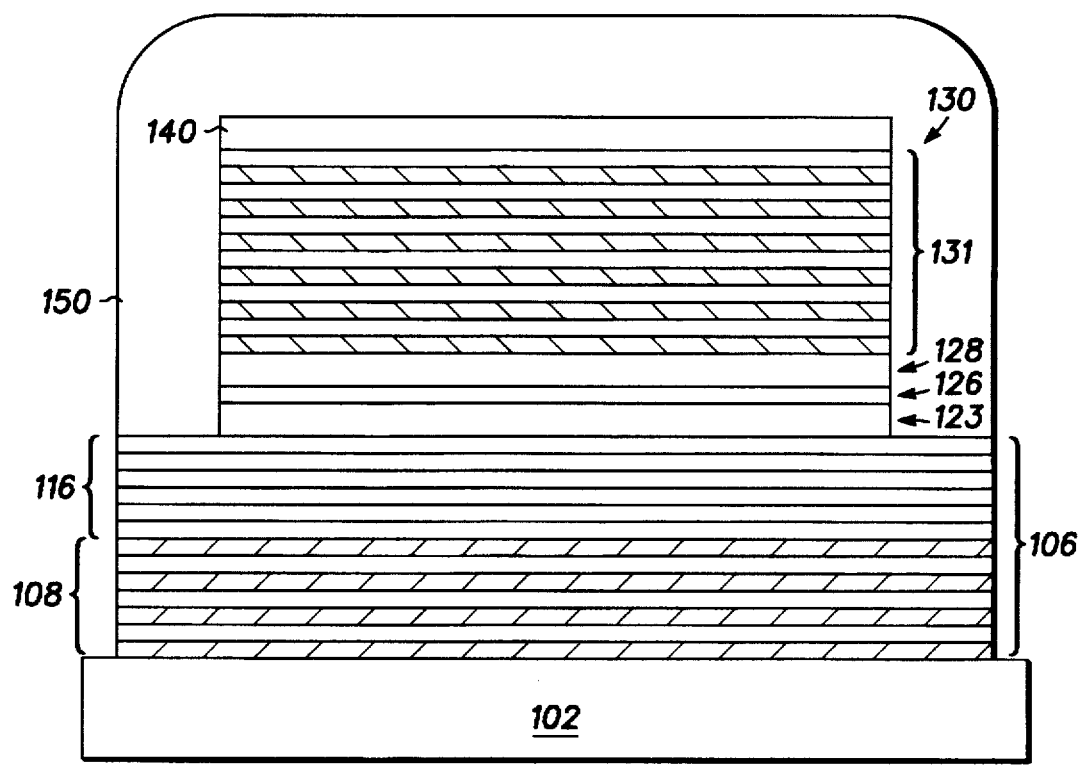
FIGS. 2 and 3 are simplified cross-sectional views illustrating different steps in the fabrication of a VCSEL in accordance with the present invention.
Figure 3:
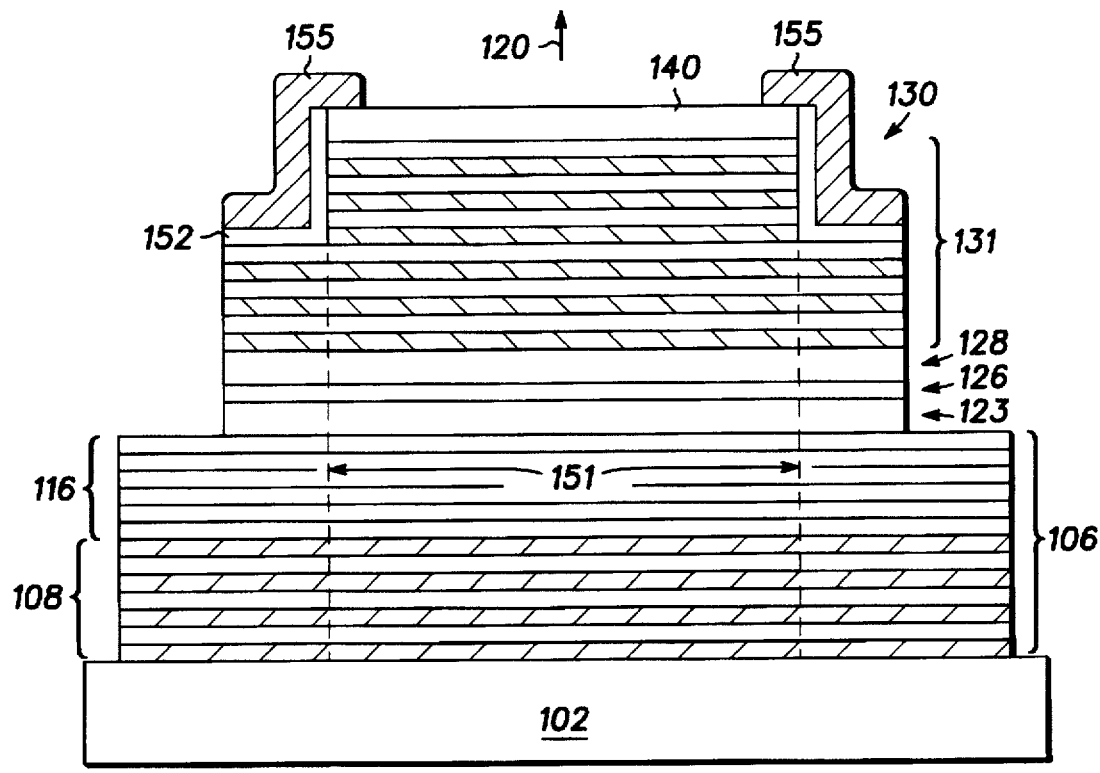

Turning now to FIGS. 2 and 3, some steps in a specific process for the fabrication of VCSEL 101 are illustrated. It will of course be understood that other methods might be utilized and the procedure to be described is simply for purposes of example and explanation. Components of the structures in FIGS. 2 and 3 which are similar to components previously illustrated and described in conjunction with FIG. 1 are designated with similar numbers.

Referring specifically to FIG. 2, substrate 102 is illustrated with first distributed Bragg reflector 106 deposited thereon. Cladding region 123, active region 126 and cladding region 128 are deposited on the upper surface of distributed Bragg reflector 106 as previously described. Distributed Bragg reflector 130 is deposited on the upper surface of cladding region 128. Here it should be noted that cladding region 123, active region 126, cladding region 128 and distributed Bragg reflector 130 are etched to define VCSEL 101 but the diameter is still substantially larger than the operating cavity region so that active region 126 will not be damaged by this etching step.

Once the above described etching step is completed, a masking layer 150 is deposited over the entire structure.

Masking layer 150 can be any material which is sufficiently impervious to the following etch and oxidation steps, e.g. photoresist, oxides, nitrides, etc. Masking layer 150 is then etched, or otherwise removed, to define a diameter or lateral extent for distributed Bragg reflector 106. Subsequently, substrate 102 is etched to expose the edge of distributed Bragg reflector 106, with the diameter of distributed Bragg reflector 106 being larger than the diameter of cladding region 123, active region 126, cladding region 128 and distributed Bragg reflector 130 by the thickness of masking layer 150.

After the edges of distributed Bragg reflector 106 are exposed by the above etching step, the etched wafer is subjected to oxidation environment, thereby oxidizing the aluminum found in alternating layers 108 of distributed Bragg reflector 106 of VCSEL 101. Stack 108 oxidizes preferentially due to higher aluminum content. Also, the oxidation speed of AlAs is much faster than that of AlGaAs. Only the AlAs layers in alternating layers 108 are oxidized because masking layer 150 protects any AlAs layers of distributed Bragg reflector 130. Oxidation of the aluminum in VCSEL 101 is achieved by any suitable method, such as steam oxidation, high pressure oxidation, or the like. It should be noted that process parameters are system specific and can range widely from system to system. For example, oxidation can be carried out at temperatures ranging from 100 degrees Celsius to 700 degrees Celsius, with pressure ranging from 0.01 atmosphere to 10 atmospheres. Aluminum arsenide layers 111 in distributed Bragg reflector 106 are substantially completely oxidized, thus their index of refraction drops from approximately 2.9 to a range between 1.3 to 1.7, and nominally to 1.55.

Once the oxidation of layers 111 is completed, masking layer 150 is removed and distributed Bragg reflector 130 is etched to form a mesa or ridge VCSEL (101), as illustrated in FIG. 3. A typical example of this procedure is described in U.S. Pat. No. 5,258,316, entitled "Patterned Mirror Vertical Cavity Surface Emitting Laser" issued Nov. 2, 1993 and assigned to the same assignee. Broken lines 151 are included in the structure of FIG. 3, to define the portion of FIG. 3 which is illustrated in FIG. 1. It will of course be understood by those skilled in the art that in some applications the structure illustrated in FIG. 1 may be the entire structure and other fabrication methods may be utilized. Upon the completion of the etching to define the mesa, a dielectric layer 152 and an electrical contact layer 155 are applied to complete VCSEL 101. In this specific embodiment, VCSEL 101 is a top emitting laser so that electrical contact layer 155 is formed to define an emitting window or aperture therethrough. However, many other types of electrical contacts may be utilized and the present structure is illustrated only for purposes of explanation.

Figure 4:
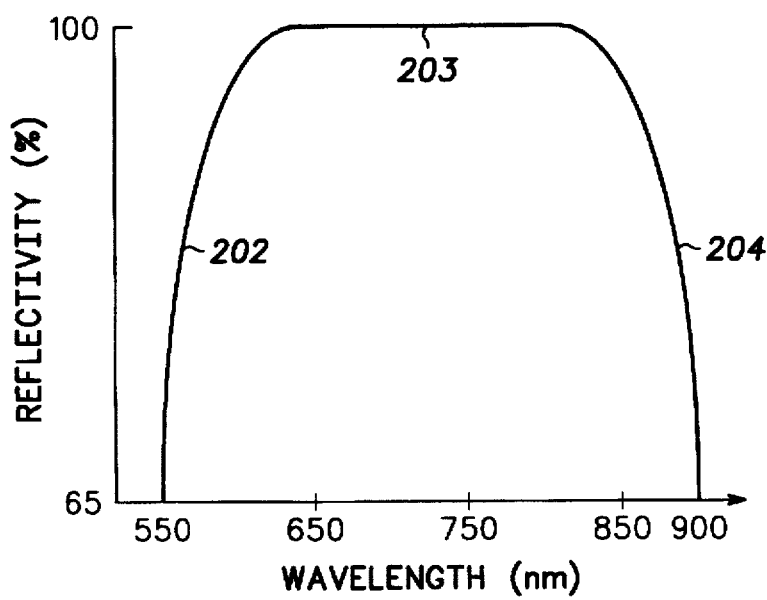
FIG. 4 is a simplified graphical illustration of reflectivity versus wavelength for the VCSEL of FIG. 1.

Referring specifically to FIG. 4, a simplified graphical representation is illustrated showing reflectivity versus wavelength for portions of VCSEL 101. A reflectivity curve 201 is illustrated, having portions 202, 203, 204, representative of the reflectivity for distributed Bragg reflector 106 of VCSEL 101 with substrate 102 being made of gallium arsenide, with five mirrored pairs of the plurality of alternating layers 108 being made of AlAs (Oxidized)/ $Al_{0.5}Ga_{0.5}As$, and with five mirrored pairs of the plurality of alternating layers 116 being made of $(In_{0.49}Al_{0.1}Ga_{0.41}P/In_{0.49}Al_{0.51}P)$. Generally, reflectivity of distributed Bragg reflector 106 of VCSEL 101 is illustrated throughout the visible spectrum, i.e., 550 nanometers to 900 nanometers. As can be seen by portion 202, reflectivity of distributed Bragg reflector 106 sharply increases and exceeds ninety percent at approximately 570 nanometers. At approximately, 600 nanometers reflectivity is in excess of 95.0 percent. In general, portion 203 illustrates reflectivity that is in excess of 99.9 percent that is from 640 nanometers to 840 nanometers. Portion 203 illustrates a wide response curve with exceptionally good reflectivity in the visible spectrum. Portion 204 illustrates a sharply declining side of the reflectivity curve 201. Thus, making distributed Bragg reflector 106 of VCSEL 101 extremely effective for reflecting light 120 that is in the visible spectrum.

While we have shown and described specific embodiments of the present invention, further modification and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A hybrid mirror structure for a visible emitting vertical cavity surface emitting laser comprising:
   a supporting substrate having a surface;
   a first distributed Bragg reflector disposed on the surface of the supporting substrate, the first distributed Bragg reflector having first pairs of alternating layers with one of the alternating layers of each of the first pairs being formed of an oxidized aluminum material and second pairs of alternating layers, with the first pairs of alternating layers being positioned adjacent the supporting substrate and the second pairs of alternating layers being positioned on the first pairs of alternating layers and cooperating with the first pairs of alternating layers to provide the first distributed Bragg reflector with increased reflectivity;
   a first cladding region disposed on the first distributed Bragg reflector, an active region disposed on the first cladding region, and a second cladding region disposed on the active region; and
   a second distributed Bragg reflector disposed on the second cladding region.

2. A hybrid mirror structure for a visible emitting vertical cavity surface emitting laser as claimed in claim 1 where, in the first pairs of alternating layers in the first distributed Bragg reflector, each pair of alternating layers includes a layer containing oxidized aluminum.

3. A hybrid mirror structure for a visible emitting vertical cavity surface emitting laser as claimed in claim 2 where, in the first pairs of alternating layers in the first distributed Bragg reflector, each pair of alternating layers includes a layer containing AlAs having an index of refraction, and Al in the AlAs is oxidized to decrease the index of refraction to a range of approximately 1.3 to 1.7.

4. A hybrid mirror structure for a visible emitting vertical cavity surface emitting laser as claimed in claim 3 where, in the first pairs of alternating layers in the first distributed Bragg reflector, each pair of alternating layers further includes a layer containing AlGaAs.

5. A hybrid mirror structure for a visible emitting vertical cavity surface emitting laser as claimed in claim 2 where, in the second pairs of alternating layers in the first distributed Bragg reflector, each pair of alternating layers includes a layer containing InAlGaP.

6. A hybrid mirror structure for a visible emitting vertical cavity surface emitting laser as claimed in claim 5 where, in the second pairs of alternating layers in the first distributed Bragg reflector, each pair of alternating layers includes a layer containing InAlP.

7. A hybrid mirror structure for a visible emitting vertical cavity surface emitting laser as claimed in claim 1 wherein the first pairs of alternating layers in the first distributed Bragg reflector include from one to ten pairs of layers.

8. A hybrid mirror structure for a visible emitting vertical cavity surface emitting laser as claimed in claim 7 wherein the first pairs of alternating layers in the first distributed Bragg reflector include five pairs of layers.

9. A hybrid mirror structure for a visible emitting vertical cavity surface emitting laser as claimed in claim 1 wherein the second pairs of alternating layers in the first distributed Bragg reflector include from one to ten pairs of layers.

10. A hybrid mirror structure for a visible emitting vertical cavity surface emitting laser as claimed in claim 9 wherein the second pairs of alternating layers in the first distributed Bragg reflector include five pairs of layers.

11. A hybrid mirror structure for a visible emitting vertical cavity surface emitting laser comprising:
    a semiconductor substrate having a surface;
    a first distributed Bragg reflector disposed on the surface of the semiconductor substrate, the first distributed Bragg reflector having first pairs of alternating layers with a first layer in each pair including an oxidized aluminum arsenide material and a second layer in each pair including an aluminum gallium arsenide material, and second pairs of alternating layers with each pair including a layer with an InAlGaP material and a layer with an InAlP material, with the second pairs of alternating layers being positioned adjacent the first pairs of alternating layers and cooperating with the first pairs of alternating layers to provide the first distributed Bragg reflector with increased reflectivity;
    a first cladding region disposed on the first distributed Bragg reflector including an InAlGaP material;
    an active region disposed on the first cladding region, the active region having a quantum well layer, a first barrier layer and a second barrier layer with the quantum well layer positioned between the first barrier layer and the second barrier layer;
    a second cladding region disposed on the active region and including an InAlGaP material; and
    a second distributed Bragg reflector disposed on the cladding region, the second distributed Bragg reflector including pairs of alternating layers with each pair including a layer with an AlAs material and a layer with an AlGaAs material.

12. A hybrid mirror structure for a visible emitting vertical cavity surface emitting laser as claimed in claim 11 where, in the first pairs of alternating layers in the first distributed Bragg reflector, each pair of alternating layers includes a layer containing AlAs having an index of refraction, and Al in the AlAs is oxidized to decrease the index of refraction to a range of approximately 1.3 to 1.7.

13. A hybrid mirror structure for a visible emitting vertical cavity surface emitting laser as claimed in claim 11 wherein the first pairs of alternating layers in the first distributed Bragg reflector include from one to ten pairs of layers.

14. A hybrid mirror structure for a visible emitting vertical cavity surface emitting laser as claimed in claim 13 wherein the first pairs of alternating layers in the first distributed Bragg reflector include five pairs of layers.

15. A hybrid mirror structure for a visible emitting vertical cavity surface emitting laser as claimed in claim 11 wherein the second pairs of alternating layers in the first distributed Bragg reflector include from one to ten pairs of layers.

16. A hybrid mirror structure for a visible emitting vertical cavity surface emitting laser as claimed in claim 15 wherein the second pairs of alternating layers in the first distributed Bragg reflector include five pairs of layers.

17. A method of fabricating a hybrid mirror structure for a visible emitting vertical cavity surface emitting laser comprising the steps of:
    providing a supporting substrate having a surface;
    disposing a first distributed Bragg reflector on the surface of the supporting substrate, forming the first distributed Bragg reflector to include first pairs of alternating layers including an aluminum material which is oxidized during the method of fabricating and second pairs of alternating layers, and positioning the first pairs of alternating layers adjacent the supporting substrate and the second pairs of alternating layers on the first pairs of alternating layers;

disposing a first cladding region on the first distributed Bragg reflector, an active region on the first cladding region, and a second cladding region on the active region; and disposing a second distributed Bragg reflector on the second cladding region.

18. A method of fabricating a hybrid mirror structure for a visible emitting vertical cavity surface emitting laser as claimed in claim 17 wherein the step of disposing the first distributed Bragg reflector on the surface of the supporting substrate includes forming each of the first pairs of alternating layers to include a layer having an index of refraction and containing oxidized aluminum.

19. A method of fabricating a hybrid mirror structure for a visible emitting vertical cavity surface emitting laser as claimed in claim 18 wherein the step of forming each of the first pairs of alternating layers to include the layer containing oxidized aluminum further includes oxidizing Al in the AlAs to decrease the index of refraction to a range of approximately 1.3 to 1.7.

20. A method of fabricating a hybrid mirror structure for a visible emitting vertical cavity surface emitting laser as claimed in claim 17 wherein the step of forming the first distributed Bragg reflector to include first pairs of alternating layers includes forming from one to ten pairs of layers.

21. A method of fabricating a hybrid mirror structure for a visible emitting vertical cavity surface emitting laser as claimed in claim 20 wherein the step of forming the first distributed Bragg reflector to include first pairs of alternating layers includes forming five pairs of layers.

22. A method of fabricating a hybrid mirror structure for a visible emitting vertical cavity surface emitting laser as claimed in claim 17 wherein the step of forming the first distributed Bragg reflector to include second pairs of alternating layers includes forming from one to ten pairs of layers.

23. A method of fabricating a hybrid mirror structure for a visible emitting vertical cavity surface emitting laser as claimed in claim 22 wherein the step of forming the first distributed Bragg reflector to include second pairs of alternating layers includes forming five pairs of layers.

24. A method of fabricating a hybrid mirror structure for a visible emitting vertical cavity surface emitting laser comprising the steps of:

providing a supporting substrate having a surface;

disposing a first distributed Bragg reflector on the surface of the supporting substrate, forming the first distributed Bragg reflector to include first pairs of alternating layers including an aluminum material and second pairs of alternating layers, and positioning the first pairs of alternating layers adjacent the supporting substrate and the second pairs of alternating layers on the first pairs of alternating layers;

disposing a first cladding region on the first distributed Bragg reflector, an active region on the first cladding region, and a second cladding region on the active region;

disposing a second distributed Bragg reflector on the second cladding region; and oxidizing the aluminum material in the first pairs of alternating layers to decrease an index of refraction of the first pairs of alternating layers to a range of approximately 1.3 to 1.7.

\* \* \* \* \*